United States Patent
Warmuth

(10) Patent No.: US 8,022,699 B2
(45) Date of Patent: Sep. 20, 2011

(54) METHOD AND APPARATUS FOR ACQUIRING A MAGNETIC RESONANCE IMAGE OF TISSUE CONTAINING IRON OXIDE

(75) Inventor: Carsten Warmuth, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 140 days.

(21) Appl. No.: 12/510,310

(22) Filed: Jul. 28, 2009

(65) Prior Publication Data

US 2010/0019765 A1    Jan. 28, 2010

(30) Foreign Application Priority Data

Jul. 28, 2008 (DE) .................... 10 2008 035 076

(51) Int. Cl.
*G01V 3/00* (2006.01)
(52) U.S. Cl. ........................... 324/307; 324/309
(58) Field of Classification Search .......... 324/307, 324/309
See application file for complete search history.

(56) References Cited

U.S. PATENT DOCUMENTS

| | | | | |
|---|---|---|---|---|
| 5,999,839 A | * | 12/1999 | Hardy et al. | 600/413 |
| 7,071,689 B2 | * | 7/2006 | Golay et al. | 324/309 |
| 2007/0104650 A1 | | 5/2007 | Cunningham et al. | |
| 2009/0027051 A1 | | 1/2009 | Stuber et al. | |

OTHER PUBLICATIONS

"Positive Contrast Magnetic Resonance Imaging of Cells Labeled with Magnetic Nanoparticles," Cunningham et al, Magnetic Resonance In Medicine, vol. 53 (2005) pp. 909-1005.
"Dephased MRI," Bakker et al, Magnetic Resonance In Medicine, vol. 55 (2006) pp. 92-97.
"Positive Contrast Visualization of Iron Oxide-Labeled Stem Cells using Inversion-Recovery With ON-Resonant Water Suppression (IRON)," Stuber et al, Magnetic Resonance In Medicine, vol. 58 (2007) pp. 1072-1077.
"Passive Tracking Exploiting Local Signal Conservation: The White Marker Phenomenon," Seppenwoolde et al, Magnetic Resonance In Medicine, vol. 50 (2003) pp. 784-790.

* cited by examiner

*Primary Examiner* — Louis Arana
(74) *Attorney, Agent, or Firm* — Schiff Hardin LLP

(57) ABSTRACT

In a method and apparatus for acquisition of a magnetic resonance (MR) image of tissue containing iron oxide particles frequency-selective inversion of the longitudinal magnetization in the tissue is done before acquisition of the MR image, and acquisition of the MR image is done at a zero crossing of the longitudinal magnetization. For water portions of the tissue, multiple inversion pulses that invert the longitudinal magnetization of the water portions are radiated into the tissue. For fat portions of the tissue, multiple inversion pulses are radiated into the tissue that invert longitudinal magnetization of the fat portions. The inversion pulses for the respective tissue portions individually exhibit a fixed time interval from one another.

9 Claims, 4 Drawing Sheets

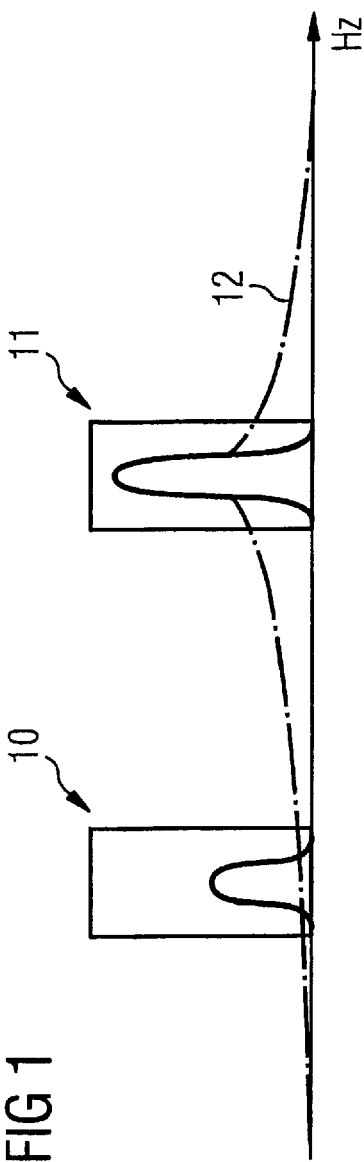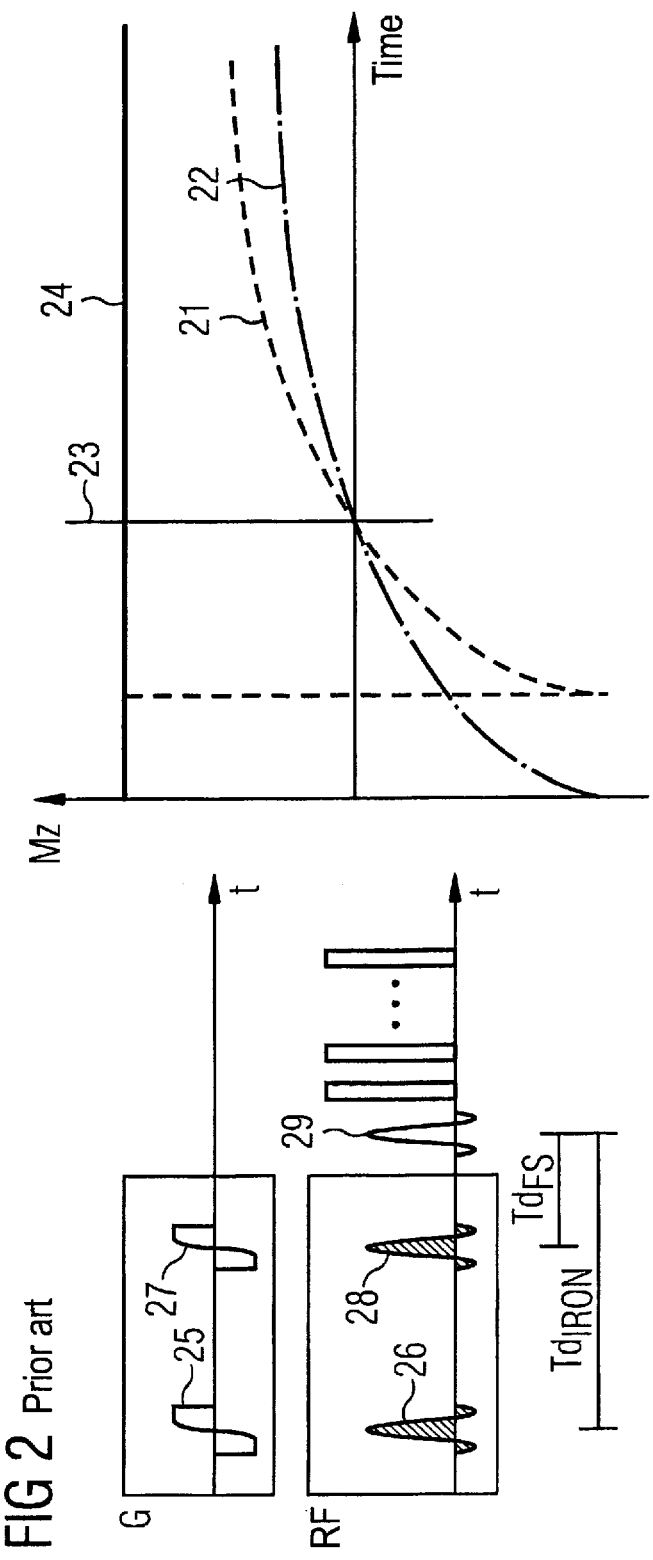

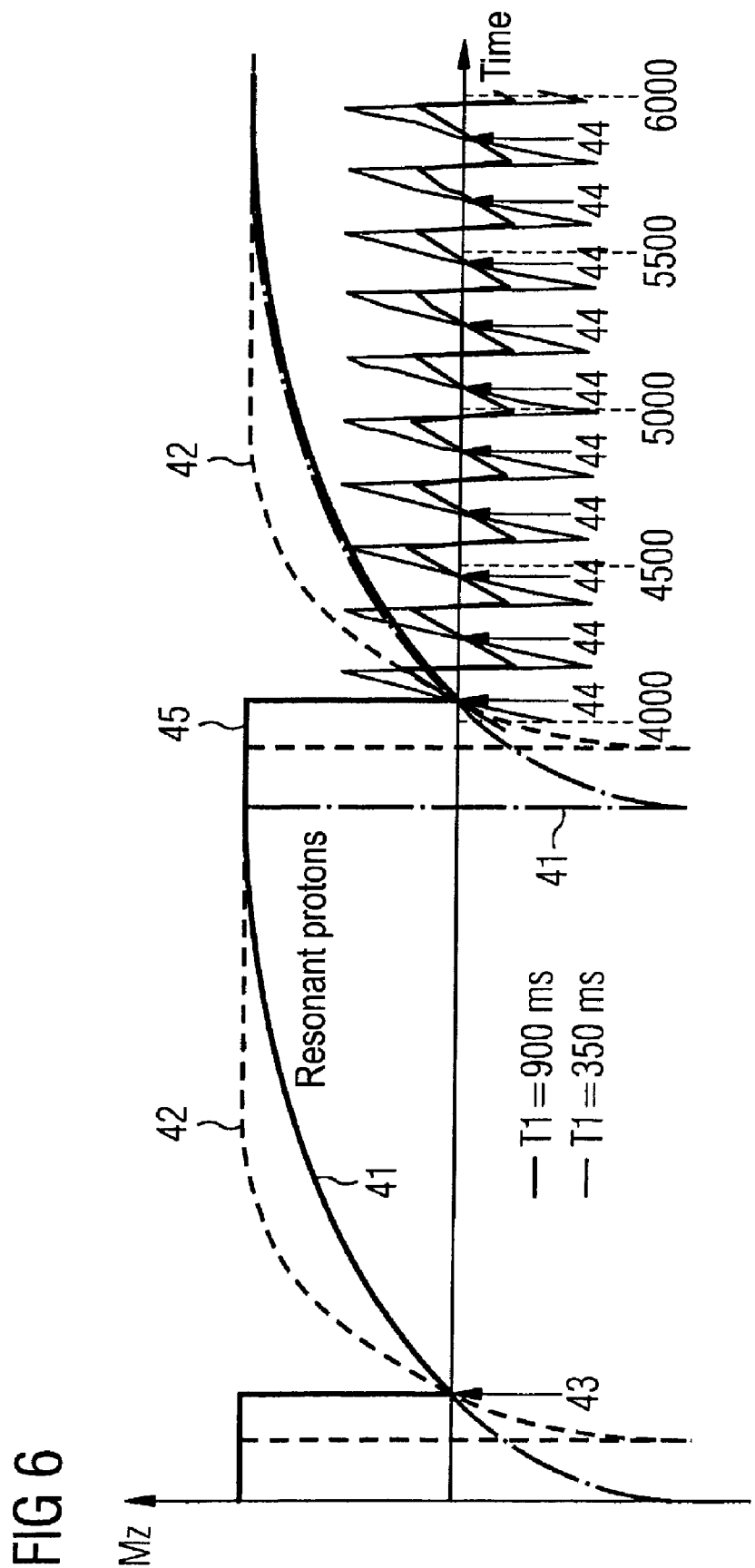

METHOD AND APPARATUS FOR ACQUIRING A MAGNETIC RESONANCE IMAGE OF TISSUE CONTAINING IRON OXIDE

BACKGROUND OF THE INVENTION

1. Field of the Invention

The present invention concerns a method and system to acquire an MR image of tissue containing iron oxide particles.

2. Description of the Prior Art

Iron oxide particles can be absorbed by cells and thus allow them to be marked. The iron can be detected in magnetic resonance tomography (MRT) with T2*-weighted gradient echo sequences that are very sensitive to magnetic field inhomogeneities. A disadvantage of the technique is that the iron oxide particles in the T2*-weighted image lead to signal losses. Therefore, areas with very low signal intensity in an MR image cannot be unambiguously ascribed to the iron oxide particles as long as other sources of signal losses (for example air pockets. (trapped air) or dephasing due to fast blood flow) cannot be precluded. A comparison acquisition before the administration of iron is thus always necessary. For this reason, measurement methods have been developed in which tissue containing iron oxide particles shows a positive image contrast. In the prior art, a number of methods are known that are all based on the fact that the iron particles generate microscopic magnetic dipoles. They generate both magnetic field gradients in their proximity and a shift of the resource frequency of the protons surrounding them. Spin echo sequences with non-selective 90° and 180° pulses are used in in Magnetic Resonance in Medicine, May 2005, 53(5):999-1005 by Charles H. Cunningham with the title "Positive contrast magnetic resonance imaging of cells labeled with magnetic nanoparticles". However, the pulses are approximately 500 to 1500 Hz removed from the resonance frequency of free protons, such that only protons with strong shift of the resonance frequency in immediate proximity to the iron oxide particles contribute to the measurement signal.

The article by J. H. Seppenwoolde "Dephased MRI" in Magnetic Resonance in Medicine, 2006, 55(1):92-97, describes detection of tissue containing iron particles using gradient echo sequences with an unbalanced echo, i.e. with a dephased 0th gradient moment at echo time. The field gradients in proximity to the particles compensate the dephasing and, in the ideal case, result in a complete measurement signal, while the protons in a homogeneous magnetic field suffer from a severe signal loss due to the dephasing.

Furthermore, the article by M. Stuber "Positive contrast visualization of iron oxide-labeled stem cells using inversion-recovery with ON-resonant water suppression (IRON)" in Magnetic Resonance in Medicine, 2007; 58(5):1072-1077 states that the iron detection ensues by a frequency-selective preparation of the longitudinal magnetization before the imaging. Resonant proton spins that exhibit no frequency shift due to iron are specifically suppressed by special prepulses. However, this method—which is also similarly described in WO 2006/084125 A1—has the disadvantage that the T1 relaxation times of the water protons can locally fluctuate severely in the measurement subject, such that a complete suppression of the resonant protons is possible only in homogeneous tissue with uniform and known T1 relaxation time.

SUMMARY OF THE INVENTION

An object of the present invention is to depict iron oxide particles with positive signal difference relative to the surrounding tissue, even given inhomogeneous tissue with different, unknown T1 times.

According to a first aspect of the invention, a method is provided for the acquisition of an MR image of a tissue containing iron oxide particles in which the longitudinal magnetization is inverted in a frequency-selective manner before acquisition of the MR image, and the MR image is ultimately acquired (i.e. magnetic resonance signals emitted by the tissue are read out) at a zero crossing of the longitudinal magnetization. According to the invention, the longitudinal magnetization is now inverted before acquisition of the MR image via multiple inversion pulses to invert the aqueous portions and via multiple inversion pulses to invert the adipose portions, wherein the inversion pulses of a tissue portion respectively exhibit a fixed time interval from one another. As will subsequently be explained in detail, it is thereby achieved that the protons have a common zero crossing of the magnetization, nearly independent of the T1 time of the appertaining tissue, such that a positive signal of the tissue which contains no iron oxide particles is essentially prevented independent of the T1 time.

The read-out magnetic resonance signals are stored as raw data in a data file, in a form that allows a magnetic resonance image of the tissue to be reconstructed.

The spectrum of a measurement subject in the human body essentially has two peaks: the peak of the water protons and the peak of the fat protons. According to the invention, frequency-selective inversion pulses for inversion of the aqueous tissue and adipose tissue are respectively radiated for the aqueous and adipose portions. The inversion pulses of the water or the inversion pulses of the fat respectively have a fixed time interval from one another, meaning that the inversion pulses for the water protons have one fixed time interval from one another and the inversion pulses for the fat protons have one fixed time interval from one another. The inversion pulses for the two tissue types are advantageously respectively frequency-selective and excite only the respective tissue components.

In order to achieve an equilibrium state in the repeatedly inverted magnetization of the aqueous and adipose portions, the longitudinal magnetization should be inverted at least 5 times (advantageously 7-10 times) before the acquisition of the MR image so that it is achieved that the zero crossing of the inverted magnetization ensues essentially at the same point in time. As is known to those skilled in the art, the zero crossing means that the magnetization in the direction of the primary magnetic field (i.e. in the direction of the longitudinal axis) is typically 0 at this point in time of the zero crossing. Stated in another way, before acquisition of the MR image the longitudinal magnetization should advantageously be inverted over four seconds (furthermore advantageously over five seconds) before the beginning of the image acquisition of the iron oxide particles.

In another embodiment of the invention, the longitudinal magnetization is furthermore inverted during the acquisition of the MR image, wherein at least one partial region of the MR image is acquired between the zero crossing and the subsequent inversion of the longitudinal magnetization. The excitation of the tissue containing iron oxide particles that should contribute signals to the MR image advantageously ensues at the point in time of the zero crossing of the inverted magnetization. A fast imaging sequence such as a turbo spin echo, a segmented gradient echo sequence or an EPI (Echo Planar Imaging) sequence is advantageously used as an imaging sequence. Furthermore, multiple 2D slices or multiple blocks of a 3D imaging sequence are advantageously acquired for the imaging, wherein at least one sub-region of a second slice is acquired between two successive inversion pulses. This interleaved acquisition technique has the advantage that the equilibrium state of the protons outside of the presently excited slice is not disrupted by the imaging. This enables a significantly faster data acquisition than in the method according to the prior art, in which one inversion is conducted per data acquisition in a slice, such that an interleaved multi-slice acquisition is not possible.

The invention furthermore concerns a magnetic resonance system to acquire an MR image of a tissue containing iron oxide particles, wherein an RF radiation unit is provided for frequency-selective inversion of a longitudinal magnetization before acquisition of the MR image, and an image acquisition unit is provided for acquisition of an MR image at a zero crossing of the longitudinal magnetization. In the present sense, all elements that are necessary for the signal detection with a coil up to the presentation of the finished MR image are in the image acquisition unit. The RF radiation unit is now fashioned such that, before acquisition of the MR image via the image acquisition unit, the longitudinal magnetization is inverted as described above via radiation of multiple inversion pulses, wherein the inversion pulses of a tissue portion respectively have a fixed time interval from one another.

BRIEF DESCRIPTION OF THE DRAWINGS

FIG. 1 shows the frequency spectrum with the fat peak and the water peak that is expanded by incorporated iron oxide particles.

FIG. 2 schematically illustrates the pulse sequence and the magnetization curve according to the prior art.

FIG. 6 shows the curve of the magnetization in the prior art and according to the present invention.

DESCRIPTION OF THE PREFERRED EMBODIMENTS

Figure 3:
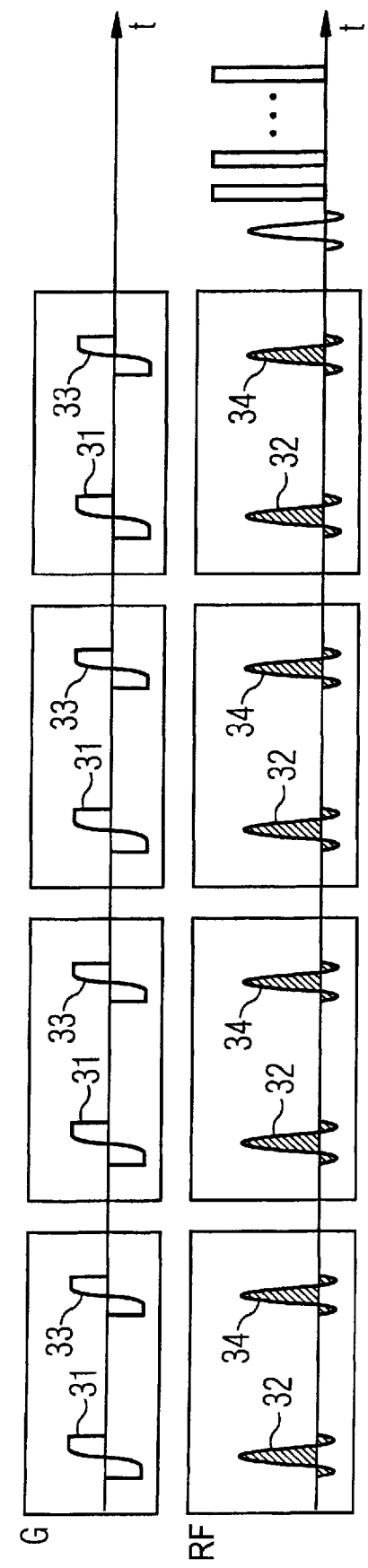
FIG. 3 schematically illustrates the imaging sequence to acquire iron oxide particles according to the present invention.

FIG. 1 shows the frequency spectrum in an ideal measurement subject, which frequency spectrum essentially consists of two peaks, namely the fat peak 10 and the water peak 11. The size difference of the two peaks is not presented here in correct scale since the water peak is typically 100 to 1000 times as large as the fat peak. If iron oxide particles that accumulate only in water are administered to an examination subject, only the water peak in the frequency spectrum is expanded, as is to be seen from the expansion 12 in FIG. 1. If the frequency ranges 10 and 11 shown in FIG. 1 are now suppressed via suitable preparation of the longitudinal magnetization, the signal portions of the tissue with iron oxide particles can have a positive signal, i.e. a signal intensified relative to the fat and water.

The known imaging sequence and the curve of the magnetization from the method described in the aforementioned article by Stuber is shown in FIG. 2. The longitudinal magnetization Mz is shown to the right in the time curve. The curve of the magnetization of the fat protons is shown in Graph 21 while the curve of the magnetization of the water protons is shown in Graph 22. As is apparent from FIG. 2, the two curves have different T1 times. In order to now ensure that, in the inversion of the fat protons and water protons, these do not simultaneously produce a contribution to the total signal in the actual signal readout for the iron oxide particles, these may not simultaneously exhibit any longitudinal magnetization. For this reason the water peak must be excited before the fat peak, for example due to the longer T1 time. The imaging for the iron oxide particles ensues at the point in time 23 when both the water protons and the fat protons have no longitudinal magnetization. The magnetization of the tissue containing iron oxide particles (which tissue is ideally not touched by the excitation) is schematically shown with 24.

The imaging sequence for achieving this is schematically shown on the left side of FIG. 2. For frequency-selective excitation of the water protons, the water pulse is inverted by switching a gradient 25 and simultaneous, frequency-selective radiation of an RF pulse 26, while the fat protons are inverted by switching the gradient 27 and the RF pulse 28 before the actual imaging via an RF pulse 29 at the point in time 23 for the acquisition of the MR image for tissue containing the iron oxide particles.

The imaging sequence for T1-independent acquisition of MR images of iron oxide particles is shown in FIG. 3. As is apparent from the curve of the gradient switching and the switching of the RF pulses, respective gradients 31 and frequency-selective RF pulses 32 for the inversion of the water protons are switched at fixed time intervals, and subsequently gradients 33 and frequency-selective RF pulses 34 to invert the fat signal portions. The time interval between the individual excitation pulses for water 32 is temporally constant, likewise the time interval between the inversion pulses for fat 34.

Figure 4:
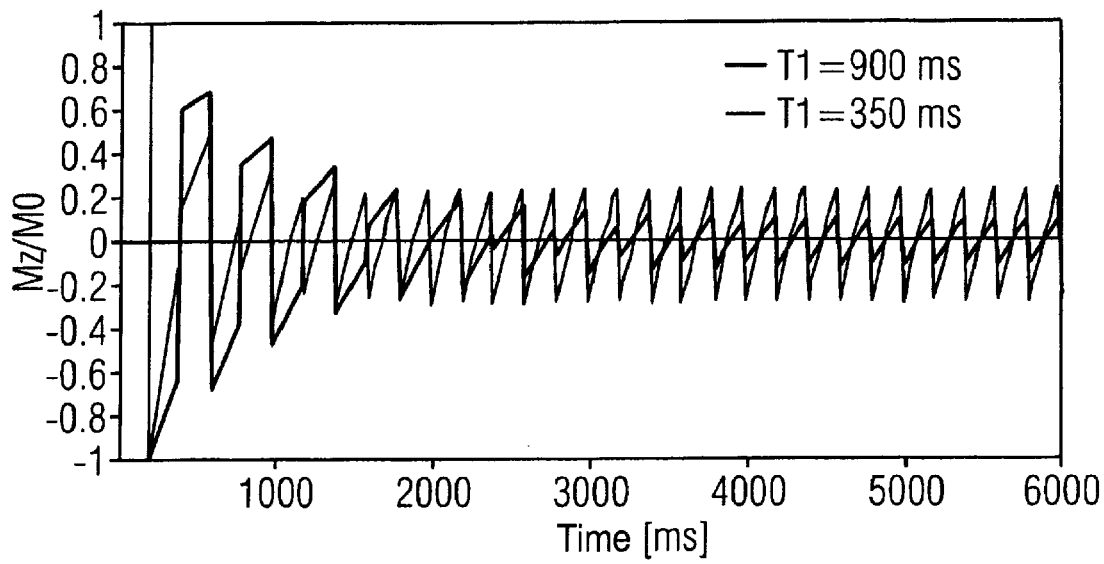
FIG. 4 is the time curve of the magnetization in the method according to the invention for two different T1 times.

The associated longitudinal magnetization for different T1 times is shown in FIG. 4, wherein the T1 times of 900 ms aqueous tissue is shown while the T1 time of 350 ms adipose tissue is symbolized. As is apparent from the time curve of the magnetization, the magnetization is reduced due to the repeated inversion and oscillates around the zero point, wherein an equilibrium state is achieved after approximately 4 to 5 seconds.

Figure 5:
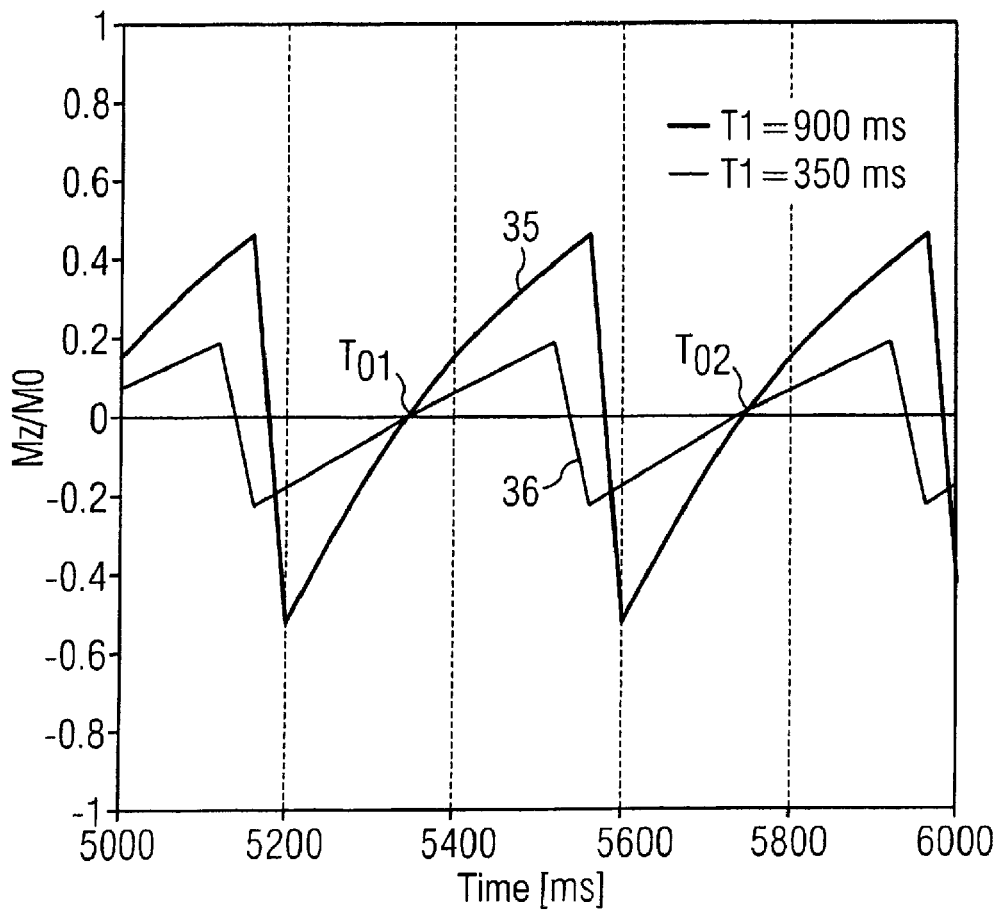
FIG. 5 is an enlarged section of the curve from FIG. 4.

A portion of the time curve of the magnetization from FIG. 4 is shown enlarged in FIG. 5, wherein it is apparent that the magnetization of the fat protons 35 and the magnetization of the water protons 36 have a common zero crossing of the magnetization at the points in time $T_{01}$ and $T_{02}$, independent of the T1 time, as is apparent from FIG. 5.

As is apparent from FIG. 4 and FIG. 5, the magnetization must be inverted a few times until the equilibrium state is achieved. After approximately 5 seconds in which the magnetization is repeatedly inverted, this equilibrium state is reached. The excitation for the imaging should now ensue at the points in time $T_{01}$ and $T_{02}$. An optimal scheme for an imaging sequence with more than one slice exists when a readout train (i.e. a sub-region of the MR image of a specific slice) is respectively acquired in the time between zero crossing of the magnetization and the following global inversion, wherein another slice can then be acquired between the next inversion pulses. The equilibrium state of the protons outside of the presently excited slice is hereby not disturbed.

The magnetization curve according to the present invention is schematically shown in the right image region in FIG. 6 while the method from Stuber according to the prior art is shown to the left. In the method according to the prior art, the water peak is first excited (as is apparent from the magnetization curve 41) before the excitation of the fat protons that have a signal curve 42. The imaging ensues at the point in time 43, at the zero crossing of the two magnetizations, wherein the protons of tissue containing iron oxide particles are excited at this point in time. The method according to the invention is presented in the right part of FIG. 6, wherein the tissues containing iron oxide particles are presented in Graph 45 in the curve of the magnetization. The interleaved acquisition of multiple slices ensues at the points in time 44 (at the points in time in which the magnetization of the water protons 41 and the magnetization of the fat protons 42 exhibit the zero crossing). As is apparent from FIG. 6, the data acquisition in the method according to the invention is considerably quicker than in the method according to the prior art that is shown to the left in the time, since an interleaved multi-slice acquisition is enabled that is not possible in the prior art.

In summary, the present invention enables the depiction of tissues containing iron oxide particles with positive signals, wherein the suppression of resonant protons is essentially T1-independent. Furthermore, a significantly accelerated imaging is possible by interleaved acquisition of multiple 2D slices or even of 3D thin-slice blocks.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A method for acquiring a magnetic resonance image of tissue containing iron oxide particles, comprising the steps of:
   exposing an examination subject having tissue therein containing iron oxide particles, and said tissue having a water portion and a fat portion, to a magnetic resonance imaging pulse sequence and, in said pulse sequence, producing a frequency-selective inversion of longitudinal magnetization of said tissue before reading out magnetic resonance signals emitted by said tissue, and reading out said magnetic resonance signals at a zero crossing of the longitudinal magnetization;
   in said pulse sequence, radiating multiple inversion pulses into said tissue that invert the longitudinal magnetization of said water portion, and radiating multiple inversion pulses into the tissue that invert the longitudinal magnetization of fat portions of said tissue;
   in said pulse sequence, interleaving said multiple inversion pulses that invert the longitudinal magnetization of the water portion with the multiple inversion pulses that invert the longitudinal magnetization of the fat portion with respective, successive inversion pulses of the interleaved multiple inversion pulses having a fixed time interval therebetween; and
   storing the magnetic resonance signals that are read out from said tissue as raw data in a data file, in a form allowing subsequent reconstruction therefrom of a magnetic resonance image of the tissue.

2. A method as claimed in claim 1 comprising inverting the longitudinal magnetization for each of said water portion and said fat portion of said tissue at least five times before reading out the magnetic resonance signals.

3. A method as claimed in claim 1 comprising inverting the longitudinal magnetization for each of said water portion and said fat portion of said tissue at least between seven and twelve before reading out the magnetic resonance signals.

4. A method as claimed in claim 1 comprising inverting the longitudinal magnetization for each of said water portion and said fat portion of said tissue at least over four seconds before reading out the magnetic resonance signals.

5. A method as claimed in claim 1 comprising inverting the longitudinal magnetization for each of said water portion and said fat portion of said tissue at least over five seconds before reading out the magnetic resonance signals.

6. A method as claimed in claim 1 comprising again inverting said longitudinal magnetization of said tissue during readout of said magnetic resonance signals, and reading out at least some of said magnetic resonance signals during a time between said zero crossing and a time at which said longitudinal magnetization of the tissue is again inverted.

7. A method as claimed in claim 6 comprising reading out said magnetic resonance signals in multiple slices of the examination subject and reading out magnetic resonance signals from at least a portion of a first of said slices between two of said multiple inversion pulses and reading out magnetic resonance signals from at least a portion of a second of said slices between subsequent inversion pulses.

8. A method as claimed in claim 1 comprising employing frequency—selective inversion pulses as said multiple inversion pulses that invert the water portion of the tissue and as the multiple inversion pulses that invert the fat portion of the tissue.

9. A magnetic resonance apparatus comprising:
   a magnetic resonance data acquisition unit configured to receive an examination subject therein; and
   a control unit configured to operate said magnetic resonance data acquisition unit by exposing an examination subject having tissue therein containing iron oxide particles, and said tissue having a water portion and a fat portion, to a magnetic resonance imaging pulse sequence and, in said pulse sequence, producing a frequency-selective inversion of longitudinal magnetization of said tissue before reading out magnetic resonance signals emitted by said tissue, and reading out said magnetic resonance signals at a zero crossing of the longitudinal magnetization;
   said control unit, in said pulse sequence, causing multiple inversion pulses to be radiated into said tissue that invert the longitudinal magnetization of said water portion, and causing multiple inversion pulses to be radiated into the tissue that invert the longitudinal magnetization of fat portions of said tissue, and to interleave said multiple inversion pulses that invert the longitudinal magnetization of the water portion with the multiple inversion pulses that invert the longitudinal magnetization of the fat portion with respective, successive inversion pulses of the interleaved multiple inversion pulses having a fixed time interval therebetween; and
   a memory accessible by said control unit in which said control unit stores the magnetic resonance signals that are read out from said tissue as raw data in a data file, in a form allowing subsequent reconstruction therefrom of a magnetic resonance image of the tissue.

* * * * *